(12) United States Patent
Koshikawa

(10) Patent No.: US 6,330,198 B1
(45) Date of Patent: Dec. 11, 2001

(54) SEMICONDUCTOR STORAGE DEVICE

(75) Inventor: Yasuji Koshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/590,239

(22) Filed: Jun. 8, 2000

(30) Foreign Application Priority Data

Jun. 9, 1999 (JP) ................................................. 11-161766

(51) Int. Cl.[7] ...................................................... G11C 7/00
(52) U.S. Cl. ............................................................ 365/200
(58) Field of Search .............................. 365/200, 230.06, 365/230.02

(56) References Cited

U.S. PATENT DOCUMENTS

| | | | | |
|---|---|---|---|---|
| 5,757,691 | * | 5/1998 | Hatakeyama | 365/63 |
| 5,841,708 | * | 11/1998 | Nagata | 365/200 |
| 6,188,620 | * | 2/2001 | Shibuya | 365/200 |

* cited by examiner

Primary Examiner—Vu A. Le
Assistant Examiner—Anh Phung
(74) Attorney, Agent, or Firm—Hayes, Soloway, Hennessey, Grossman & Hage, P.C.

(57) ABSTRACT

A semiconductor storage device can improve probability of relieving of defective cell. The semiconductor storage device includes a redundancy cell for relieving a defective cell when the defective cell is found during fabrication process of a memory cell, a redundancy judgment circuit making judgment whether an input address is a column address of the defective cell or not and redundancy column selection lines for making the redundancy cell active when the redundancy judgment circuit makes judgment that the input address is the column address of the defective cell. The semiconductor storage device further includes means for dividing the redundancy cell connected to one redundancy column selection line into a plurality of divided redundancy cells and assigning the column address of the defective cell to each of divided redundancy cells as relieving address.

11 Claims, 12 Drawing Sheets

SEMICONDUCTOR STORAGE DEVICE

BACKGROUND OF THE INVENTION

1. Field of the Invention

The present invention relates generally to a semiconductor storage device. More particularly, the invention relates to a semiconductor storage device which enables relieving by programming a column address of a defective cell in a redundancy judgment circuit when a defective memory cell is found during fabrication process.

2. Description of the Related Art

Conventionally, in the semiconductor storage device of this type is constructed with a column decoder 10, a redundancy column decoders 2 and 3, a row decoder 4, a memory cell array 20, an amplifier circuit 6, a redundancy judgment circuits 11 and 12, an internal clock generating circuit 31, a command decoder 32, an internal address generating circuit 33, a column system circuit 34, an input/output circuits 35 to 38 and a row system control signal generating circuit 39, as shown in FIG. 9.

The internal clock generating circuit 31 generates an internal clock ICLK on the basis of a reference clock CLK input externally. The command decoder 32 inputs /RAS, /CAS, /WE and /CS. The row system control signal generating circuit 39 receives a result of decoding from the command decoder 32 to generate a row system control signal.

The column system circuit 34 receives a result of decoding from the command decoder 32 to generate a column system control signal. An internal address generator circuit 33 is responsive to an external address input ADD and the result of decoding from the command decoder 32 to generate a row address and a column address in synchronism with the internal clock ICLK.

The row decoder 4 is responsive to the row system control signal and the row address to select one of a plurality of word lines WL depending upon the row address and also one of a plurality of a plate selection signals (not shown).

The redundancy judgment circuits 11 and 12 are responsive to the column address to make judgment whether the input column address is a preliminarily programmed redundancy address or not to output redundancy judgment signals R1 and R2.

The column decoder 10 is responsive to the column address and the redundancy judgment signals R1 and R2 not to select or select one of a plurality of column selection lines depending upon the column address. The redundancy column decoders 2 and 3 are responsive to the redundancy judgment signals R1 and R2 for determining whether the corresponding redundancy column selection line is to be selected or not.

The memory cell array 20 is connected to the word lines WL, the column selection lines, the redundancy selection line and an IO (input/output) line for receiving inputs therethrough. The input/output circuits 35 to 38 are connected one of input/output terminals DQ0 to DQ3 to read out data on read/write buses RWBUS0 to RWBUS3 or write data in the read/write buses RWBUS0 to RWBUS3 corresponding to output of the column system circuit 34 and whereby to perform reading and writing. The amplifier circuit 6 is connected to the column system circuit 34 to receive output therefrom and also to the I0 line and the read/write buses RWBUS0 to RWBUS3.

As shown in FIG. 10, the memory cell array 20 is constructed with a plurality of plates (plate 1, plate 2 . . . ). Each plate is connected to a plurality of word lines WL and a plurality of bit line pairs which are, in turn, connected to sense amplifiers (SA). Each column line and each redundancy column line are connected to four sense amplifiers per plate, respectively.

On the other hand, the sense amplifier SA receives a plate selection signal (plate selection signal 1, plate selection signal 2 . . . ) corresponding to each plate on the bit line pair connected thereto. Four sense amplifiers connected to the same column line or the same redundancy column selection line in each plate are connected to respectively different IO lines.

Four IO lines wired to each plate are connected to respectively corresponding IO lines of other plate output side of the memory cell array 20, and are also connected to the amplifier circuit 6. To the bit line pair and the work line WL, a plurality of memory cells are connected.

The redundancy column decoders 2 and 3 receives respective redundancy judgment signals R1 and R2, as shown in FIG. 11, and are constructed with buffer circuits (BUF) 2a and 3a driving one redundancy column selection line.

The column decoder 10 is constructed with an OR circuit 10a deriving an OR of the redundancy judgment signals R1 and R2, AND circuits 10b-1 to 10b-n deriving AND of an output of the OR circuit 10a and the column address. A plurality of column addresses input to respective AND circuits 10b-1 to 10b-n have different combination of high (High)/low (Low) per address so as to select only one column selection line.

Next, discussion will be given for operation of the conventional semiconductor storage device with reference to FIG. 12. The semiconductor storage device receives active command upon rising of the clock of cycle C1 (not shown) to select one of the word lines WL of row address corresponding to the data on the address terminal and one of the plate selection signals selecting the plate including the selected word line WL.

Subsequently, upon rising the clock of cycle C2, the read command is input and, at this time, if the data of the address terminal is a normal column address not preliminarily programmed in the redundancy judgment circuits 11 and 12, both of the redundancy judgment signals R1 and R2 are redundancy non-selected condition (low level), one column selection line corresponding to the data of the address terminal is selected (low level), and the redundancy selection line is not selected (low level).

Then, upon rising of the clock of the cycle C3, the semiconductor storage device receives the read command and if the data of the address terminals is the redundancy column address preliminarily programmed in the redundancy judgment circuit 11, the programmed redundancy judgment signal R1 output from the redundancy judgment circuit 11 becomes selected condition (high level), and all of the column selection lines becomes non-selected state (low level). Also, the redundancy selection line corresponding to the redundancy judgment signal R1 becomes selected condition (high level), and other redundancy column selection lines are not selected (low level).

Furthermore, upon rising of the clock of the cycle C4, the semiconductor storage device receives the read command and if the data of the address terminals is the redundancy column address preliminarily programmed in the redundancy judgment circuit 11, the programmed redundancy judgment signal R2 output from the redundancy judgment circuit 11 becomes selected condition (high level), and all of the column selection lines becomes non-selected state (low level). Also, the redundancy selection line corresponding to the redundancy judgment signal R2 becomes selected condition (high level), and other redundancy column selection lines are not selected (low level).

The column selection line corresponding to the programmed column address is not selected even when the corresponding address is input, and in place, the redundancy column selection line is selected. Therefore, the bit line and the sense amplifier connected to the defective cell are not used, and through the sense amplifier and bit line connected to the redundancy column selection line, the redundancy memory cell is selected.

Accordingly, even when defective memory cell is found during fabrication process of the semiconductor storage device, it can be relieved by programming the column address of the defective cell in the redundancy judgment circuits 11 and 12.

On the other hand, in each read command input cycle, data amplified by selected one of the sense amplifiers is transmitted to each IO line, and then, is input to the amplifier circuit 6. Data further amplified by the amplifier circuit 6 is transmitted to the input/output circuits 35 to 38 through the read/write buses RWBUS0 to RWBUS3, and then output to the input/output terminals DQ0 to DQ3 at a predetermined timing.

On the other hand, upon inputting of the write command, data input to the input/output terminals DQ0 to DQ3 is transmitted to the amplifier circuit 6 via the input/output circuits 35 to 38 and the read/write buses RWBUS0 to RWBUS3, and is written in selected one of the sense amplifiers via the IO line and subsequently written to the selected memory cell via connected bit line pair.

In the foregoing semiconductor storage device, even when the defective memory cell is found in the fabrication process, the storage device can be relieved by programming the column address of the defective cell in the redundancy judgment circuit. However, if defective cells are caused beyond a number of the redundancy selection lines connected to the redundancy judgment circuit, the foregoing measure will not work.

SUMMARY OF THE INVENTION

The present invention has been worked out in view of the problem set forth above. It is therefore an object of the present invention to provide a semiconductor storage device which can improve probability of relieving of defective cell.

According to one aspect of the present invention, a semiconductor storage device comprises:

a redundancy cell for relieving a defective cell when the defective cell is found during fabrication process of a memory cell;

a redundancy judgment circuit making judgment whether an input address is a column address of the defective cell or not;

redundancy column selection lines for making the redundancy cell active when the redundancy judgment circuit makes judgment that the input address is the column address of the defective cell;

means for dividing the redundancy cell connected to one redundancy column selection line into a plurality of divided redundancy cells and assigning the column address of the defective cell to each of divided redundancy cells as relieving address.

Namely, the semiconductor storage device according to the present invention is provided with a plurality of redundancy judgment circuit for permitting programming of a plurality of relieving address for one redundancy column (COLUMN).

By this, with among a plurality of memory cells selected by one redundancy column selection line and other redundancy cell, relieving with other redundancy cell becomes possible to improve probability of relieving of the defective cell.

In the preferred construction, a plurality of the redundancy judgment circuits are provided for making judgment whether the input address is the relieving address assigned for each of the divided redundancy cell. The semiconductor storage device may further comprise logic operation means for performing logical operation for respective outputs of a plurality of the redundancy judgment circuits and means for selecting any one of a plurality of redundancy column lines depending upon a result of operation of the logic operation means. The logic operation means may perform operation of logical sum of outputs of the plurality of redundancy judgment circuits.

The semiconductor storage device may further comprise means for switching between input/output line of the redundancy cell in the memory cell and normal input/output line depending upon a result of judgment by the redundancy judgment circuit. The switching means may be constructed for switching the input/output line of the redundancy cell and the input/output line of the normal cell. The semiconductor storage device may be constructed to select the column selection line of the normal cell irrespective of the result of judgment of the redundancy judgment circuit.

A plurality of redundancy judgment circuits are provided corresponding to number of division of the redundancy cell. The redundancy cell may be divided into two, the redundancy judgment circuit in number of double of the redundancy column selection lines are provided. When the redundancy cell is divided into four, the redundancy judgment circuit in number of four times of the redundancy column selection lines may be provided. The means for selecting one of the plurality of redundancy column selection lines comprises a buffer circuit for driving selected redundancy column selection line.

BRIEF DESCRIPTION OF THE DRAWINGS

The present invention will be understood more fully from the detailed description given hereinafter with reference to the accompanying drawings of the preferred embodiment of the present invention, which, however, should not be taken to be limitative to the present invention, but are for explanation and understanding only.

In the drawings.

DESCRIPTION OF THE PREFERRED EMBODIMENT

Figure 1:
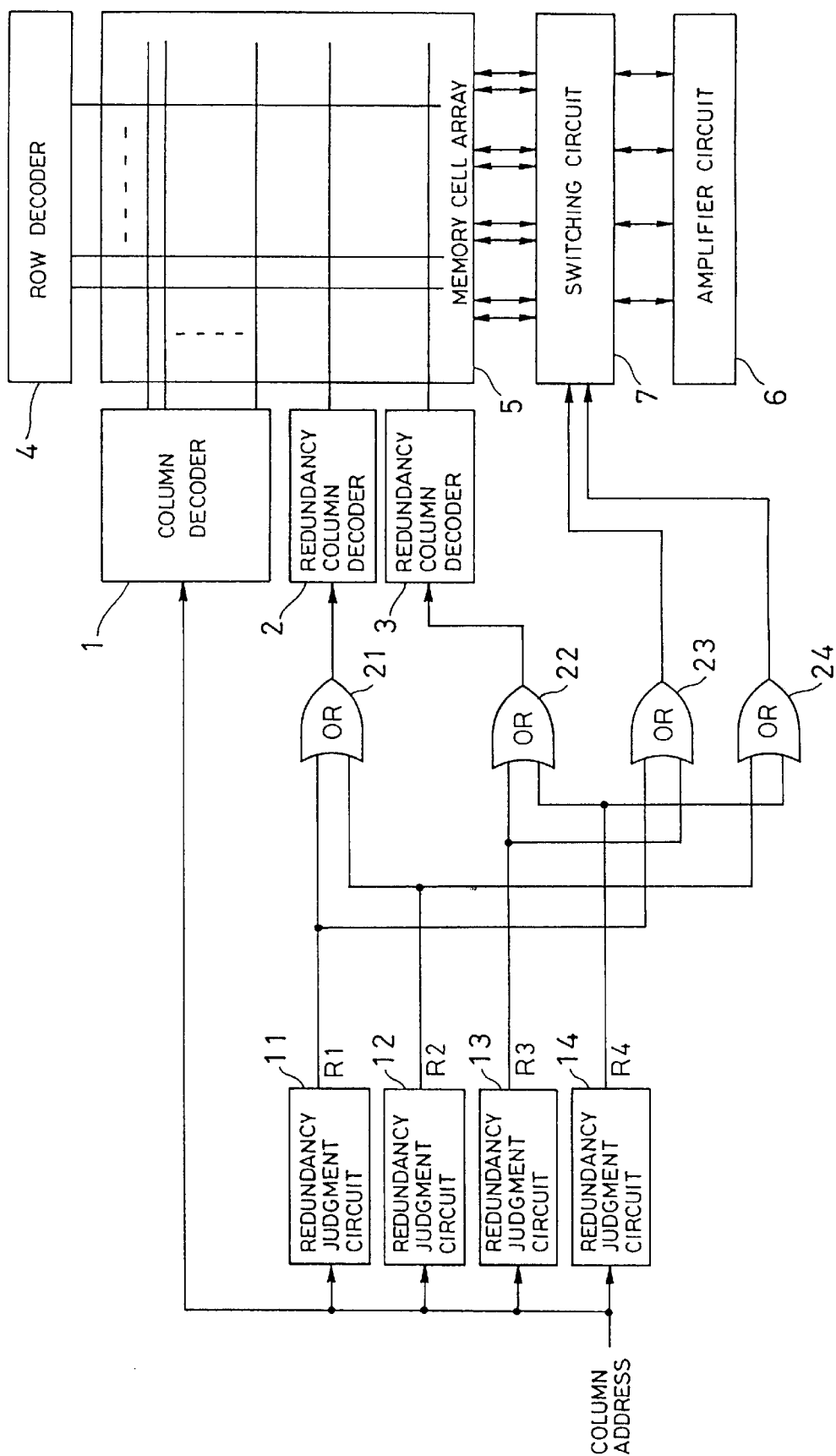
FIG. 1 is a circuit diagram showing one embodiment of a semiconductor storage device according to the present invention.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention. Also, like components as those discussed in connection with the prior art with reference to FIG. 9 will be identified by the like reference numerals, and detailed discussion for such common components will be omitted in order to avoid redundant discussion and whereby to keep the disclosure simply enough to facilitate clear understanding of the invention. One embodiment illustrated in FIG. 1 will be discussed only for different points in comparison with the conventional semiconductor storage device shown in FIG. 9.

Figure 9:
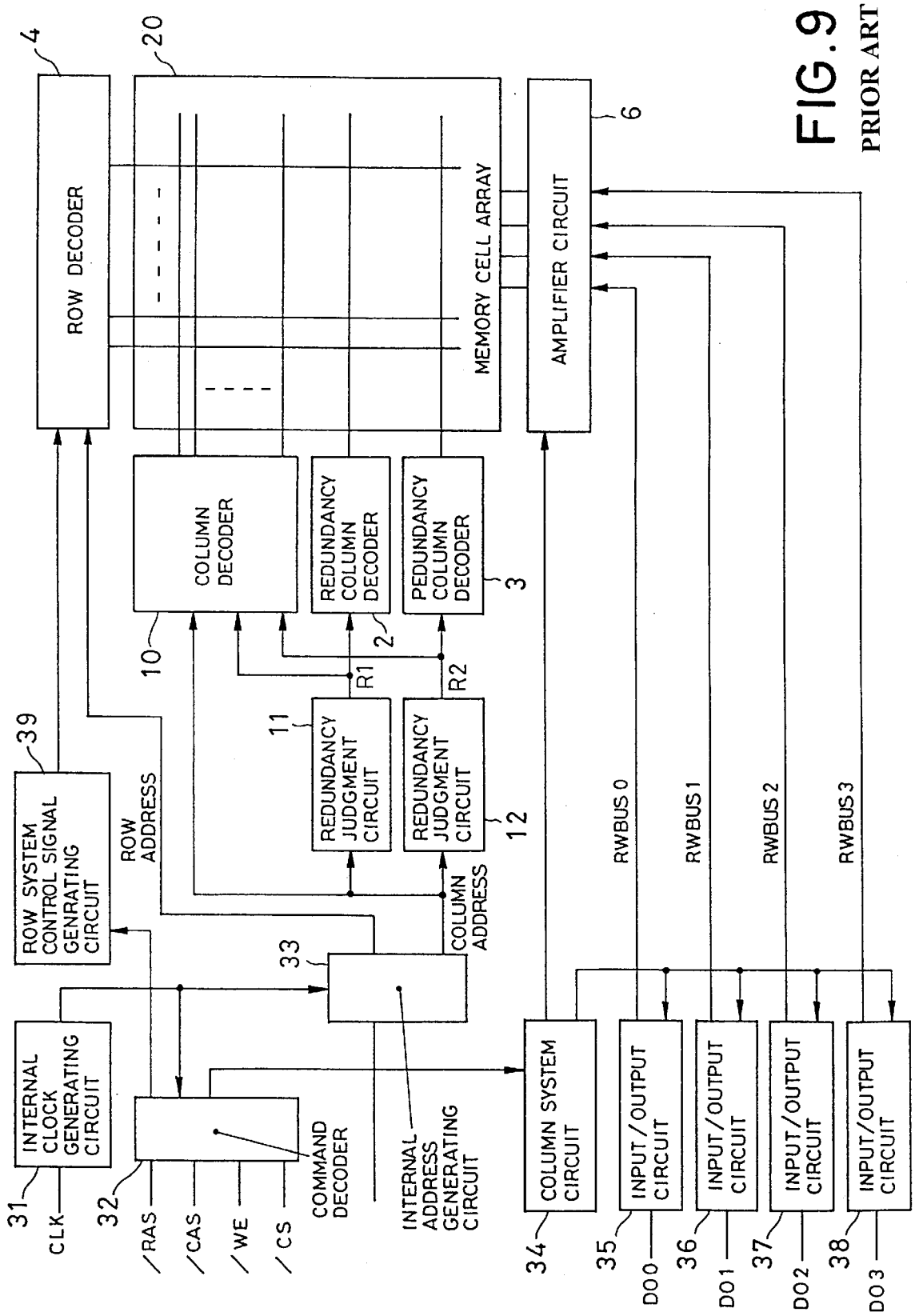
FIG. 9 is a circuit diagram showing a construction of the conventional semiconductor storage device.
Figure 10:
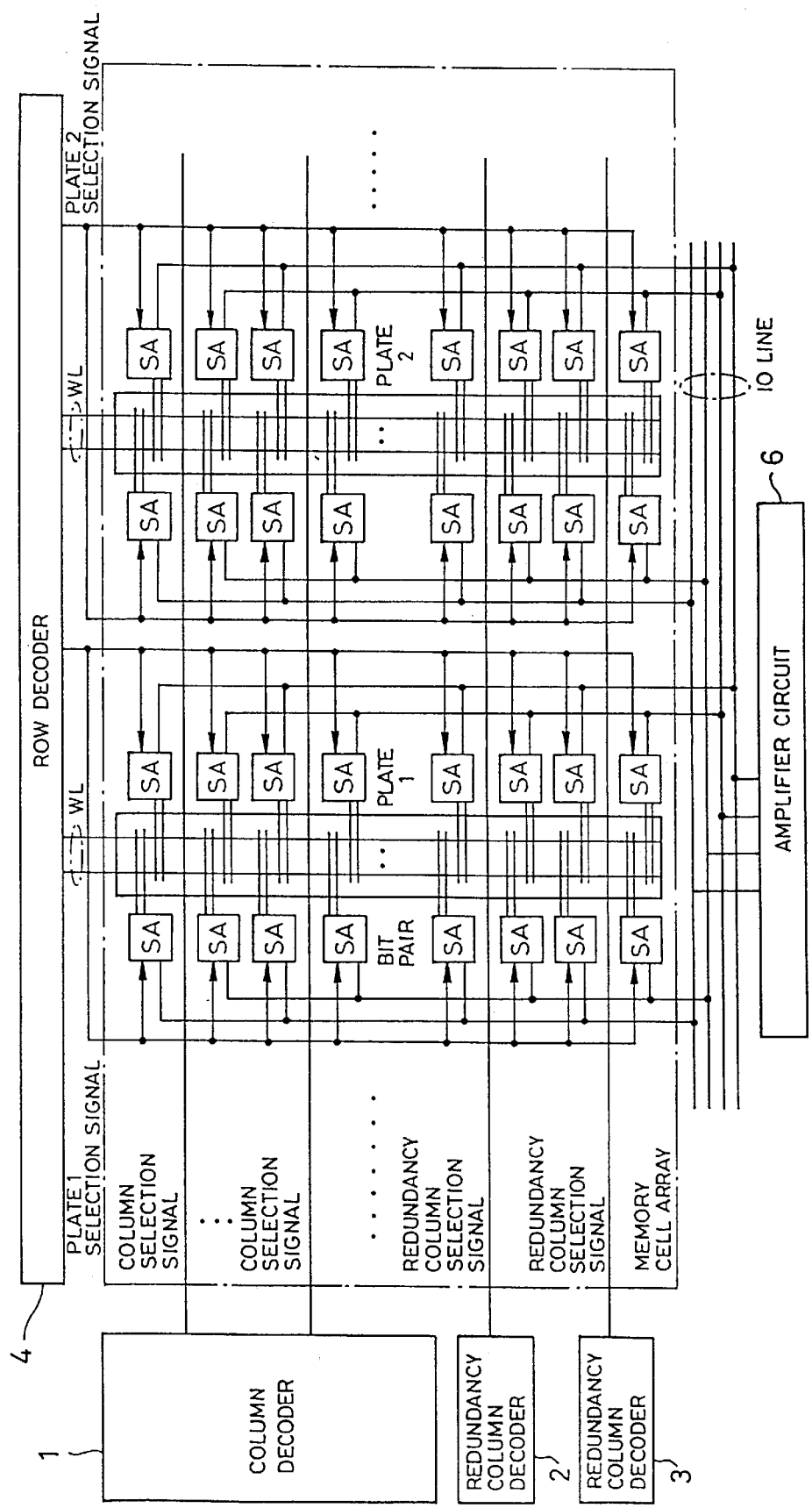
FIG. 10 is an illustration showing the detailed construction of the memory cell array of FIG. 9.
Figure 11:
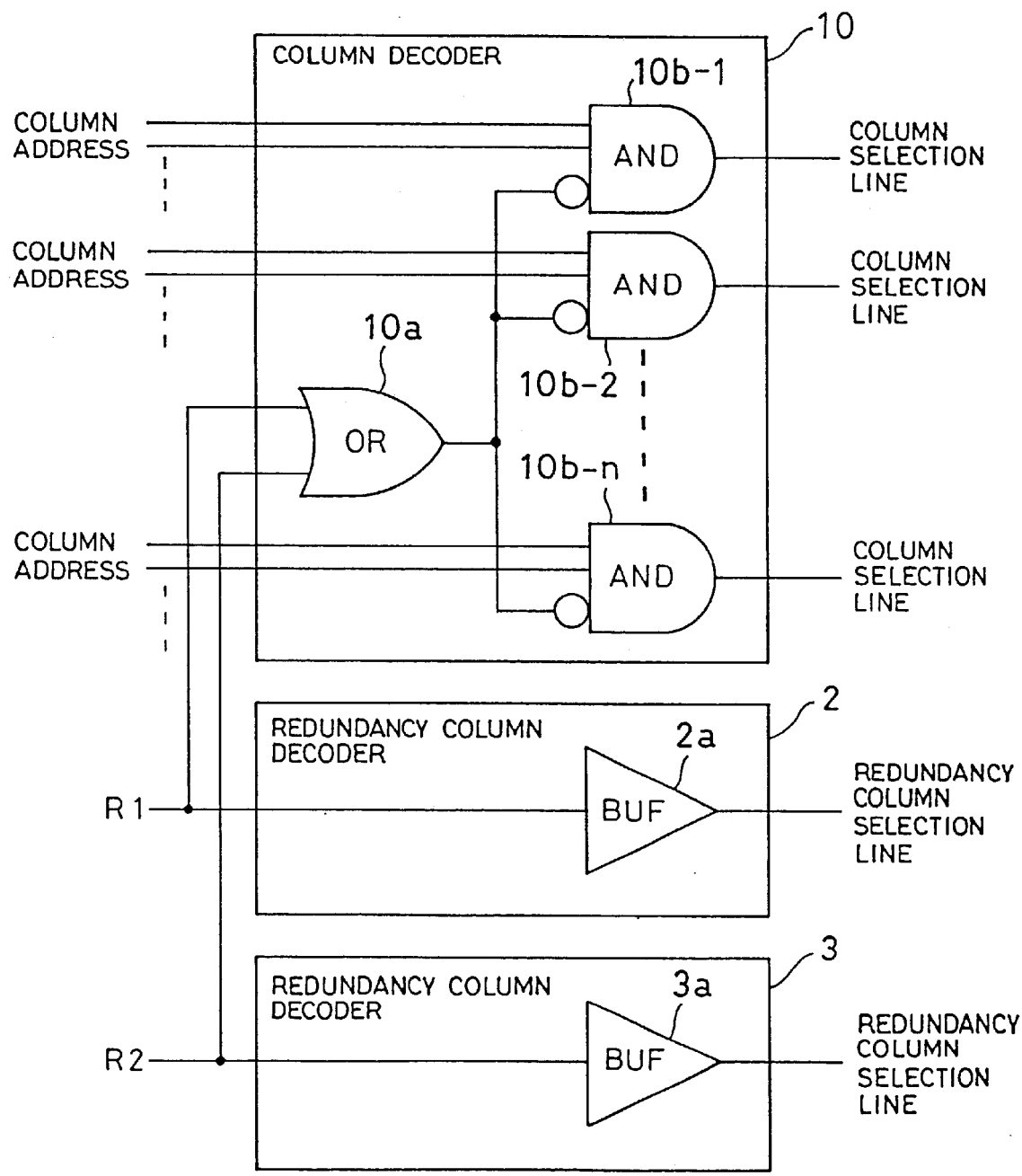
FIG. 11 is a circuit diagram showing the detailed construction of the column decoder and the redundancy column decoder of FIG. 9.
Figure 12:
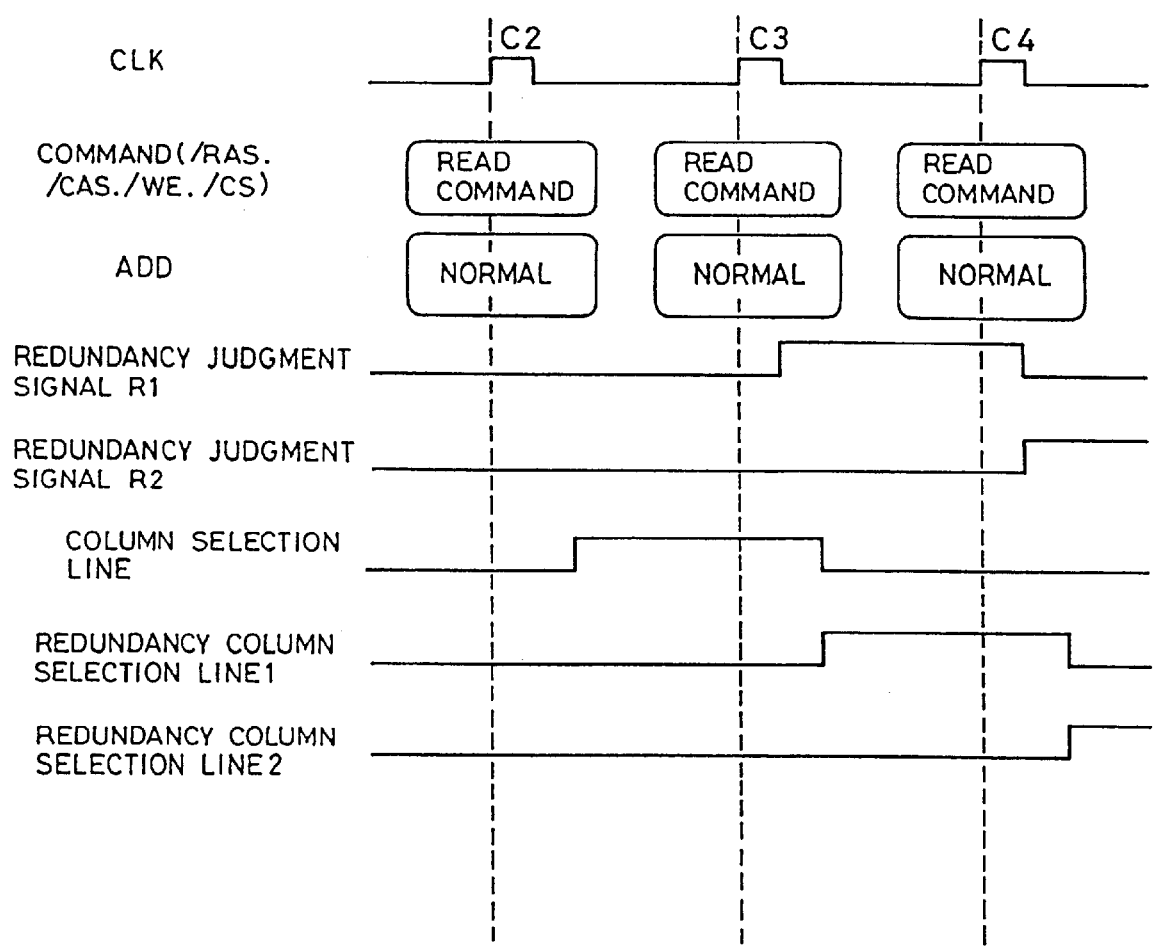
FIG. 12 is a timing chart showing the operation of the conventional semiconductor storage device.

Namely, one embodiment of the semiconductor storage device according to the present invention has the same construction as the conventional semiconductor storage device shown in FIG. 9 except for four redundancy judgment circuits 11 to 14, four OR circuits 21 to 24 and a switching circuit 7. However, as will be discussed later, structures of the column decoder 1 and the memory cell array 5 are different from the conventional semiconductor storage device.

In the shown embodiment, the OR circuit 21 derives an OR of the redundancy judgment signal R1 output from the redundancy judgment circuit 11 and the redundancy judgment signal R2 output from the redundancy judgment circuit 12. An output of the OR circuit 21 is input to the redundancy column decoder 2. The OR circuit 22 derives an OR of the redundancy judgment signal R3 output from the redundancy judgment circuit 13 and the redundancy judgment signal R4 output from the redundancy judgment circuit 14. An output of the OR circuit 22 is input to the redundancy column decoder 3.

The OR circuit 23 derives an OR of the redundancy judgment signal R1 output from the redundancy judgment circuit 11 and the redundancy judgment signal R3 output from the redundancy judgment circuit 13. An output of the OR circuit 23 is input to the switching circuit 7. The OR circuit 24 derives an OR of the redundancy judgment signal R2 output from the redundancy judgment circuit 12 and the redundancy judgment signal R4 output from the redundancy judgment circuit 14. An output of the OR circuit 24 is input to the switching circuit 7.

The redundancy column decoder 2 receives output of the OR circuit 21 to output the redundancy selection signal. The redundancy column decoder 3 receives output of the OR circuit 22 to output the redundancy selection signal. The switching circuit 7 are connected the OR circuits 23 and 24 and a plurality of IO lines, and is further connected to the amplifier circuit 6 by a connection bus.

Figure 2:
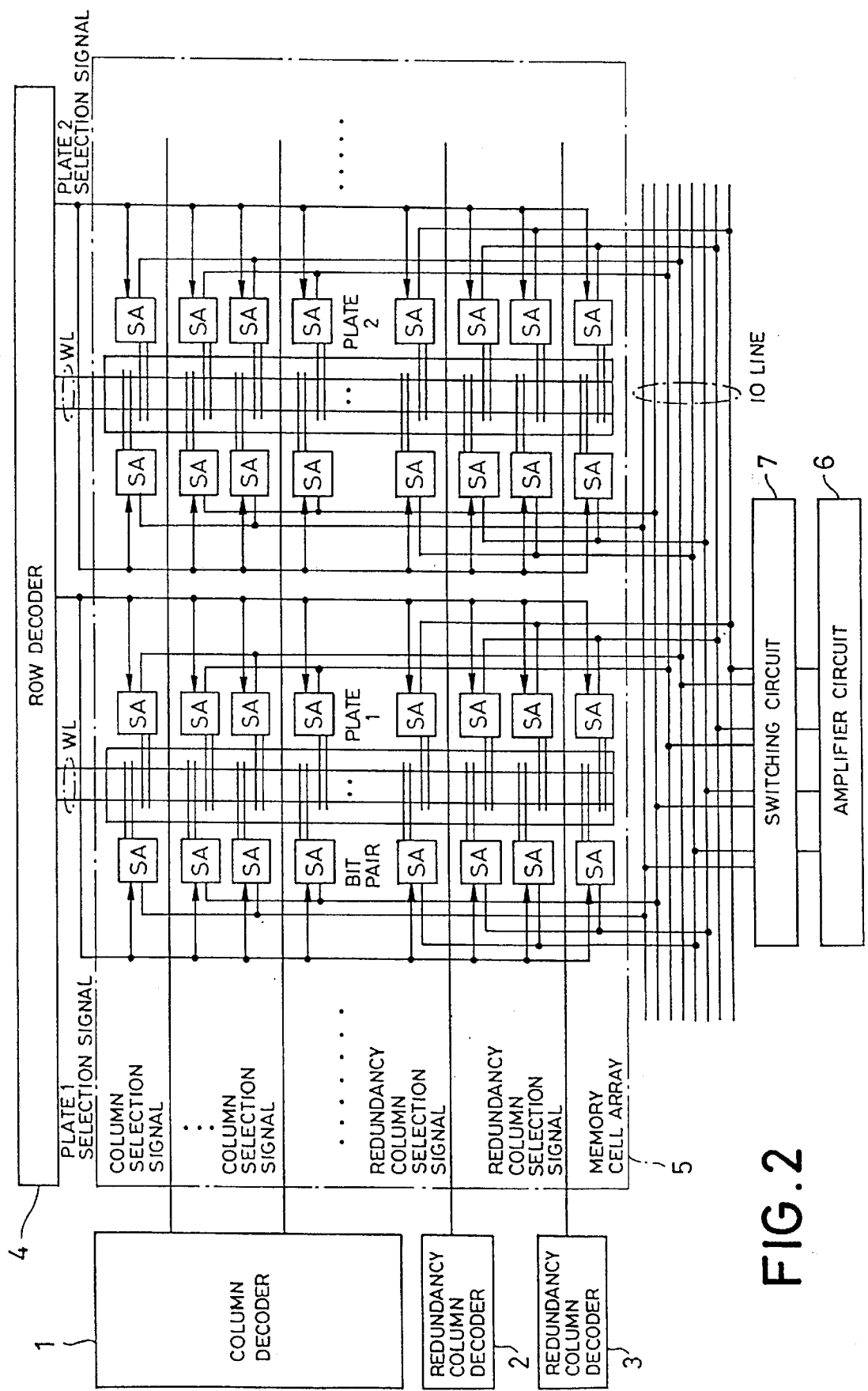
FIG. 2 is an illustration showing a detailed construction of a memory cell array of FIG. 1.

FIG. 2 is an illustration showing the detailed construction of the memory cell array 5 of FIG. 1. In FIG. 2, the memory cell array 5 differentiates the IO lines between the sense amplifier (SA) connected to the redundancy column selection line and the sense amplifier connected to the redundancy column selection line. Both IO lines are connected to the same switching circuit 7.

Figure 3:
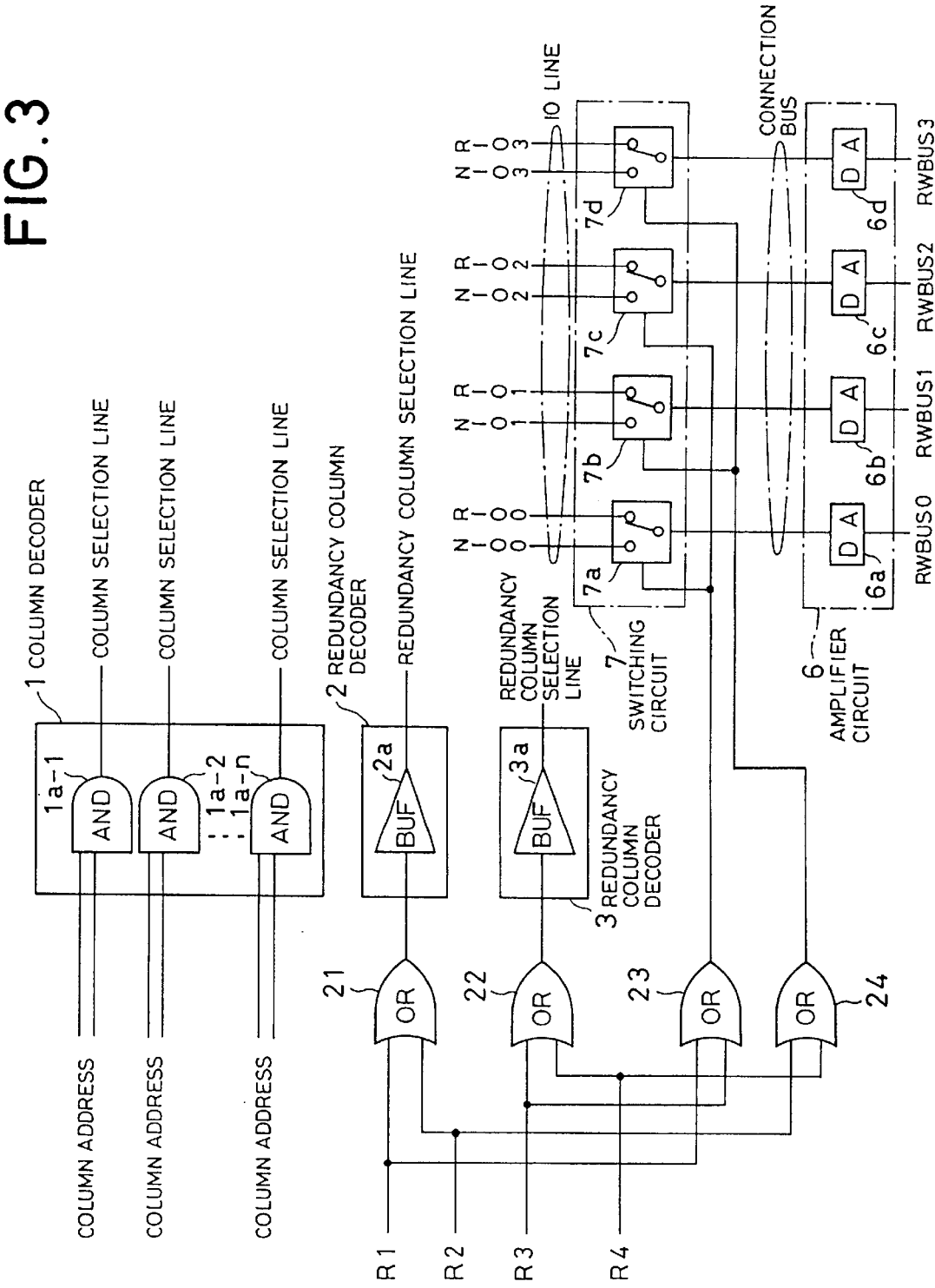
FIG. 3 is a circuit diagram showing a detailed construction of a column decoder and a redundancy column decoder of FIG. 1.

FIG. 3 is a circuit diagram showing a detailed construction of the column decoder 1 and the redundancy column decoders 2 and 3 of FIG. 1. In FIG. 3, the redundancy column decoders 2 and 3 is constructed with the buffer circuits 2a and 3a which receive outputs of the OR circuits 21 and 22, respectively and drive one redundancy column selection line. The column decoder 1 is constructed with a plurality of AND circuits 1a-1 to 1a-n respectively receiving column address.

On the other hand, the amplifier circuit 6 is constructed with data amplifiers (DA) 6a to 6d connected to read/write buses RWBUS0 to RWBUS3, respectively. The switching circuit 7 is constructed with switches 7a to 7d connected to the OR circuits 23 and 24 and the connection buses.

A plurality of column addresses respectively input to a plurality of AND circuits 1a-1 to 1a-n are differentiated combination of high (High)/low (Low) levels per address. It should be noted that the column decoder 1 is different from that of the prior art and does not receive OR of the redundancy judgment signal.

On the other hand, to the switching circuit 7, IO lines NIO0 to NIO3 transmitting data of the sense amplifiers SA connected to the column selection lines and IO lines RIO0 to RIO3 transmitting data of the sense amplifiers connected to the redundancy column selection lines, are connected.

In the switching circuit 7, the switch 7a switches connection between the IO lines NIO0 and RIO0, the switch 7b switches connection between the IO lines NIO1 and RIO1, the switch 7c switches connection between the IO lines NIO2 and RIO2, and the switch 7d switches connection between the IO line NIO3 and RIO3, respectively depending upon a level of the outputs of respective OR circuits 23 and 24. Data of connected four IO lines are transmitted to the amplifier circuit 6 via four connection buses.

Figure 4:
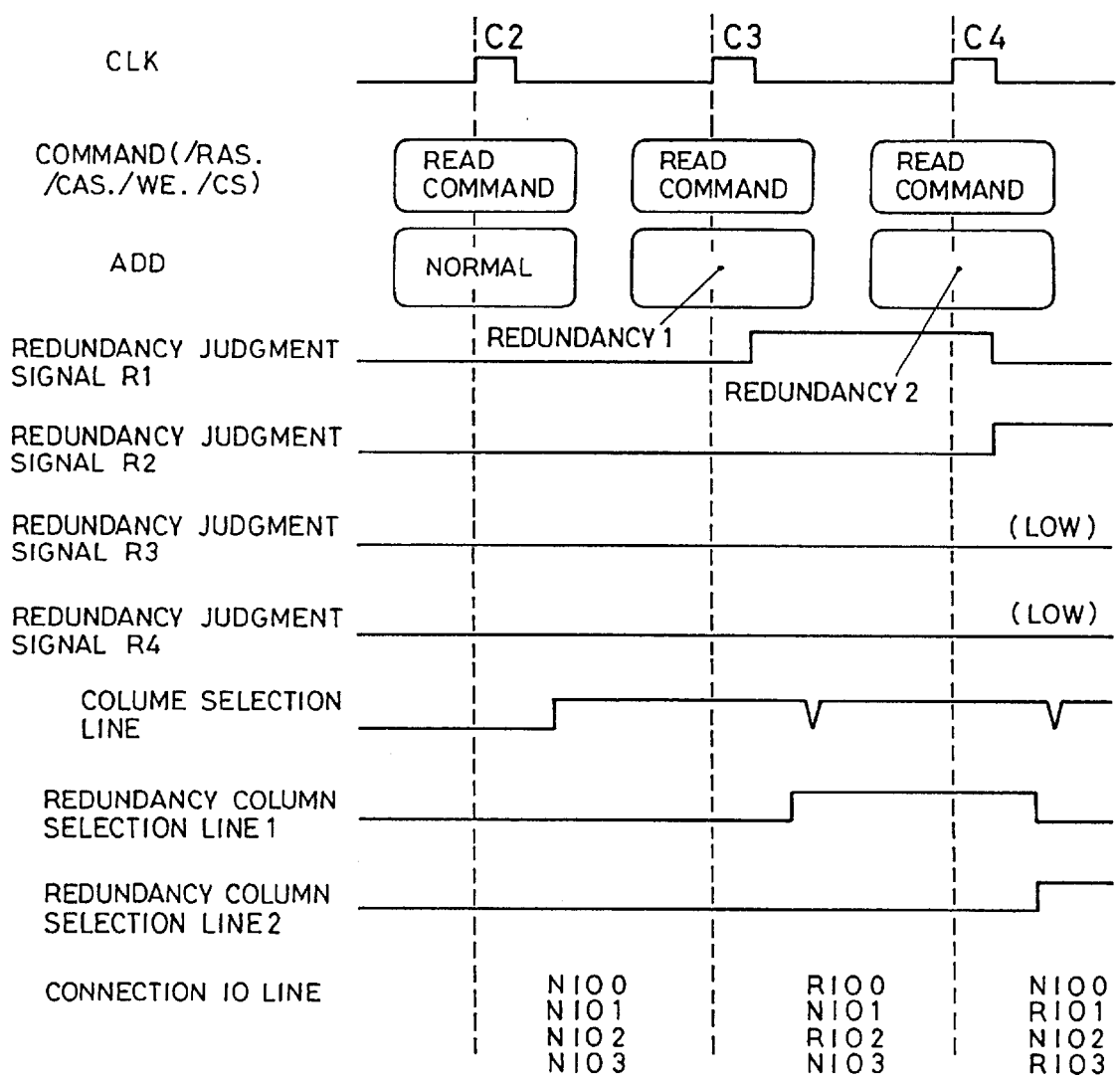
FIG. 4 is a timing chart showing an operation of one embodiment of the semiconductor storage device according to the present invention.

FIG. 4 is a timing chart showing operation of one embodiment of the semiconductor storage device according to the present invention. Operation of one embodiment of the semiconductor storage device according to the present invention will be discussed with reference to FIGS. 1 to 4. Since cycles C2, C3 and C4 shown in FIG. 4 are read command inputs, one of the column selection lines corresponding to data of the address terminal ADD is selected. The semiconductor storage device receives the read command upon Rising of the clock of the cycle 3. If the data of the address terminal ADD is the redundancy column address preliminarily programmed in the redundancy judgment circuit 11, the redundancy judgment signal R1 output from the programmed redundancy judgment circuit 11 becomes selected condition (high level). Then, outputs of OR circuits 21 and 23 become high level. Accordingly, corresponding redundancy column selection line 1 is selected (high level) and the other redundancy column selection lines 2 are not selected (low level).

Subsequently, the semiconductor storage device receives the read command upon rising of the clock of the cycle C4. If the data of the address terminal ADD is the preliminarily programmed redundancy column address, the redundancy judgment signal R2 output from the programmed redundancy judgment circuit 12 becomes selected condition (high level). Then, outputs of OR circuits 22 and 24 become high level. Accordingly, corresponding redundancy column selection line 2 is selected (high level) and the other redundancy column selection lines 1 are not selected (low level).

On the other hand, in the cycle C2, the outputs of the OR circuits 23 and 24 are both low level. In the cycle C3, the output of the OR circuit 23 is high level and the output of the OR circuit 24 is low level. In the cycle C4, the output of the OR circuit 23 is low level and the output of the OR circuit 24 is high level. Therefore, IO lines are connected As shown in FIG. 4.

Namely, in the switching circuit 7, in the cycle C2, the switch 7a selects the IO line NIO0, the switch 7b selects the IO line NIO1, the switch 7c selects the IO line NIO2, and the switch 7d selects the IO line NIO3. Then, data on selected four IO lines NIO0, NIO1, NIO2 and NIO3 are transmitted to the amplifier circuit 6 via four connection buses.

In the switching circuit 7, in the cycle C3, the switch 7a selects the IO line RIO0, the switch 7b selects the IO line NIO1, the switch 7c selects the IO line RIO2, and the switch 7d selects the IO line NIO3. Then, data on selected four IO lines RIO0, NIO1, RIO2 and NIO3 are transmitted to the amplifier circuit 6 via four connection buses.

In the switching circuit 7, in the cycle C4, the switch 7a selects the IO line NIO0, the switch 7b selects the IO line RIO1, the switch 7c selects the IO line NIO2, and the switch 7d selects the IO line RIO3. Then, data on selected four IO lines NIO0, RIO1, NIO2 and RIO3 are transmitted to the amplifier circuit 6 via four connection buses.

In the shown embodiment, double in number of the redundancy judgment circuits 11 to 14 are provided for the redundancy column selection lines. Four IO lines are divided into two sets. The redundancy judgment circuits 11 to 14 are corresponded to respective sets to perform relieving of the defective cells, probability of relieving of the defective products can be improved.

Figure 5:
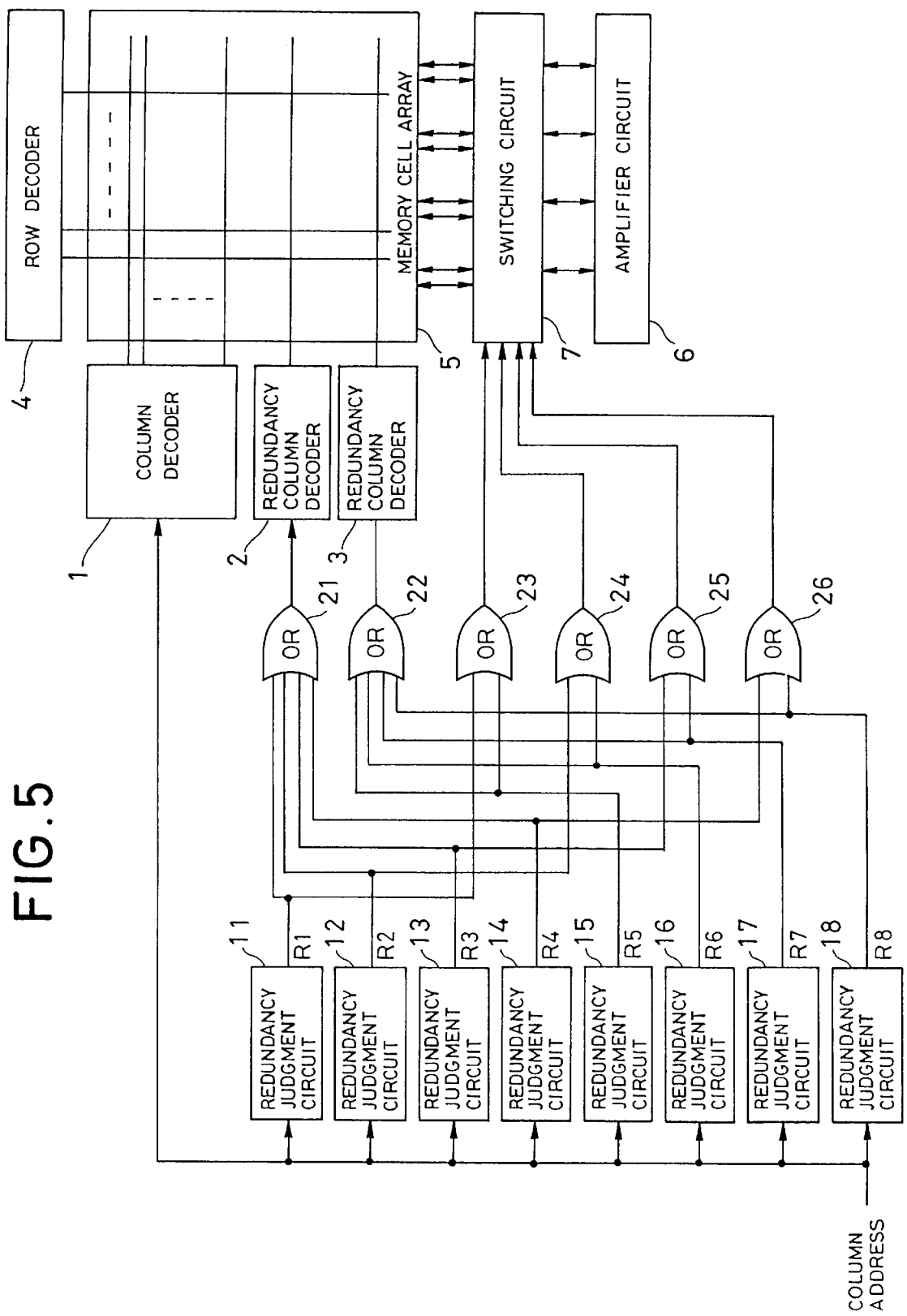
FIG. 5 is a circuit diagram showing a construction of another embodiment of the semiconductor storage device according to the present invention.

FIG. 5 is a circuit diagram showing a construction of another embodiment of the semiconductor storage device according to the present invention. In FIG. 5, another embodiment of the semiconductor storage device according to the present invention is provided with four redundancy judgment circuits 11 to 14 and 15 to 18 corresponding to each redundancy selection line, and the redundancy judgment circuits 11 to 18 are corresponded to four IO lines. It should be noted that like components as those discussed in connection with the foregoing first embodiment will be identified by the like reference numerals, and detailed discussion for such common components will be omitted in order to avoid redundant discussion and whereby to keep the disclosure simply enough to facilitate clear understanding of the invention. One embodiment illustrated in FIG. 1 will be discussed only for different points in comparison with the first embodiment of the semiconductor storage device shown in FIG. 1.

Namely, the shown embodiment of the semiconductor storage device according to the present invention has the same construction as the former embodiment of the semiconductor storage device of the invention shown in FIG. 1 except that four redundancy judgment circuits 15 to 18 and two OR circuits 25 and 26 are added.

In the shown embodiment, the OR circuit 21 derives OR of the redundancy judgment signals R1 to R4 of the redundancy judgment circuits 11 to 14, and the result of OR is output to the redundancy column decoder 2. The OR circuit 22 derives OR of the redundancy judgment signals R5 to R8 of the redundancy judgment circuits 15 to 18, and the result of OR is output to the redundancy column decoder 8.

The OR circuit 23 derives OR of the redundancy judgment signals R1 of the redundancy judgment circuit 11 and the redundancy judgment signal R5 of the redundancy judgment circuit 15 to output the result of OR operation to the switching circuit 7. The OR circuit 24 derives OR of the redundancy judgment signals R2 of the redundancy judgment circuit 12 and the redundancy judgment signal R6 of the redundancy judgment circuit 16 to output the result of OR operation to the switching circuit 7.

The OR circuit 25 derives OR of the redundancy judgment signals R3 of the redundancy judgment circuit 13 and the redundancy judgment signal R7 of the redundancy judgment circuit 17 to output the result of OR operation to the switching circuit 7. The OR circuit 26 derives OR of the redundancy judgment signals R4 of the redundancy judgment circuit 14 and the redundancy judgment signal R8 of the redundancy judgment circuit 18 to output the result of OR operation to the switching circuit 7.

The redundancy column decoder 2 receives the output of the OR circuit 21 to output the redundancy column selection signal. The redundancy column decoder 3 receives the output of the OR circuit 22 to output the redundancy column selection signal. The switching circuit 7 is connected to the OR circuits 23 to 26 and a plurality of IO lines and is further connected to the amplifier circuit 6 via connection buses.

Figure 6:
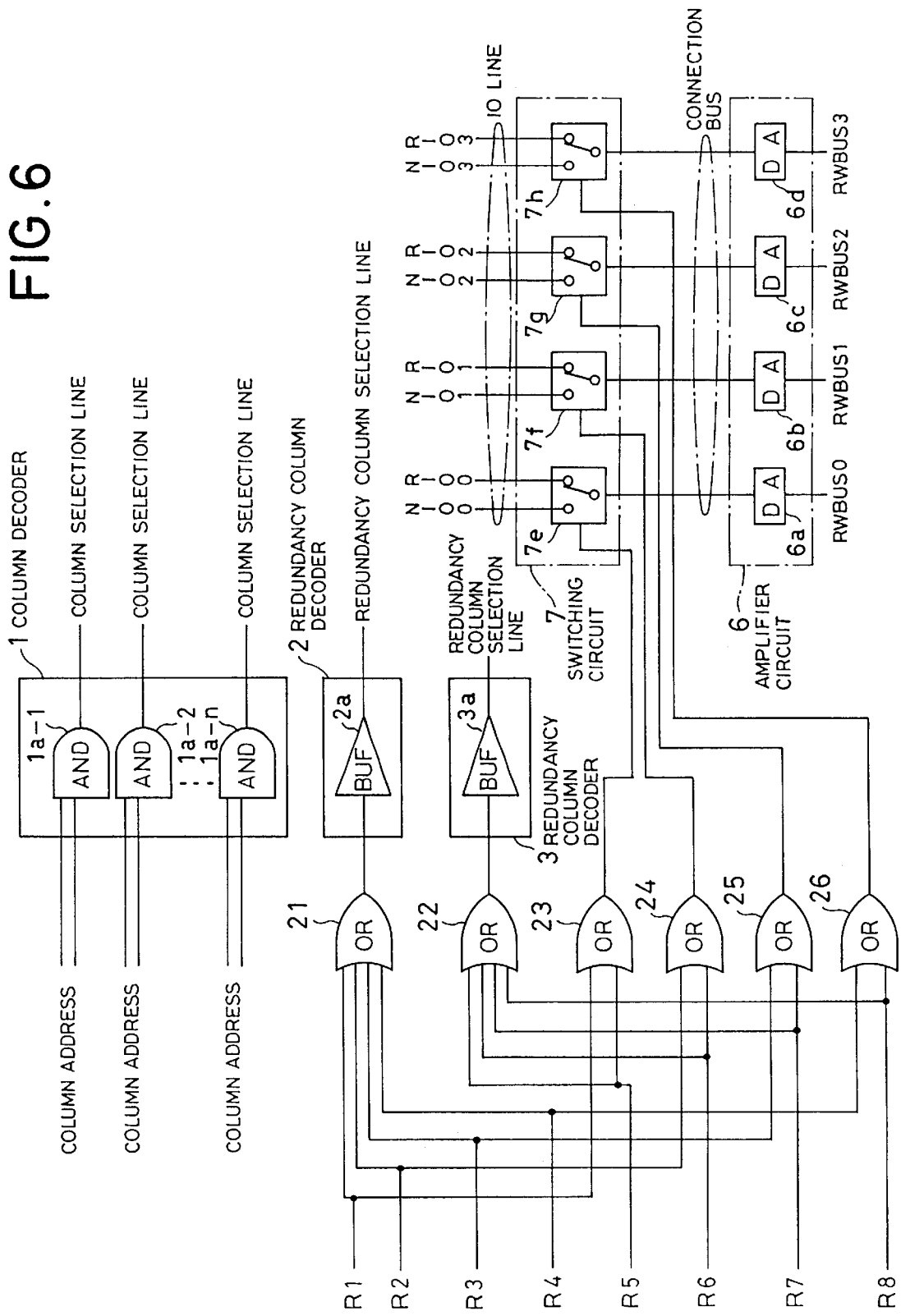
FIG. 6 is a circuit diagram showing a construction of another embodiment of the semiconductor storage device according to the present invention.

FIG. 6 is a circuit diagram showing detailed constructions of the column decoder 1 and the redundancy column decoders 2 and 3. In FIG. 5, the redundancy column decoders 2 and 3 is constructed with buffer circuits 2a and 3a which receive outputs of the OR circuits 21 and 22, respectively and drive one redundancy column selection line. The column decoder 1 is constructed with a plurality of AND circuits 1a-1 to 1a-n receiving the column address.

The amplifier circuit 6 is constructed with data amplifiers DA6a to DA6d connected to the read/write buses RWBUS0 to RWBUS3, respectively. The switching circuit 7 is constructed with switches 7e to 7h connected to the OR circuits 23 to 26 and the connection bus.

The column addresses to be input to a plurality of AND circuits 1a-i to 1a-n differentiate combination of high (High)/low (Low) per address for selecting (high level) only one column line. Different from the prior art, the column decoder 1 does not receive OR of the redundancy judgment signal.

To the switching circuit 7, the IO lines NIO0 to NIO3 transmitting data of the sense amplifier connected to the column selection lines, and the IO lines RIO0 to RIO3 transmitting data of the sense amplifier connected to the redundancy column selection lines are connected.

In the switching circuit, the switch 7e switches between the IO line NIO0 and the IO line RIO0 depending upon the level of the output of the OR circuit 23. The switch 7f switches between the IO line NIO1 and the IO line RIO1 depending upon the level of the output of the OR circuit 24. The switch 7g switches between the IO line NIO2 and the IO line RIO2 depending upon the level of the output of the OR circuit 25. The switch 7h switches between the IO line NIO3 and the IO line RIO3 depending upon the level of the output of the OR circuit 26. Data of connected four IO lines are transmitted to the amplifier circuit 6 via the four connection buses.

As set forth above, the shown embodiment provides four redundancy judgment circuits 11 to 14 and 15 to 18 for each redundancy column selection line and establishes correspondence of four IO lines to respective redundancy judgment circuits 11 to 18 for relieving the defective cell. Therefore, probability of relieving of the defective product can be improved.

Figure 7:
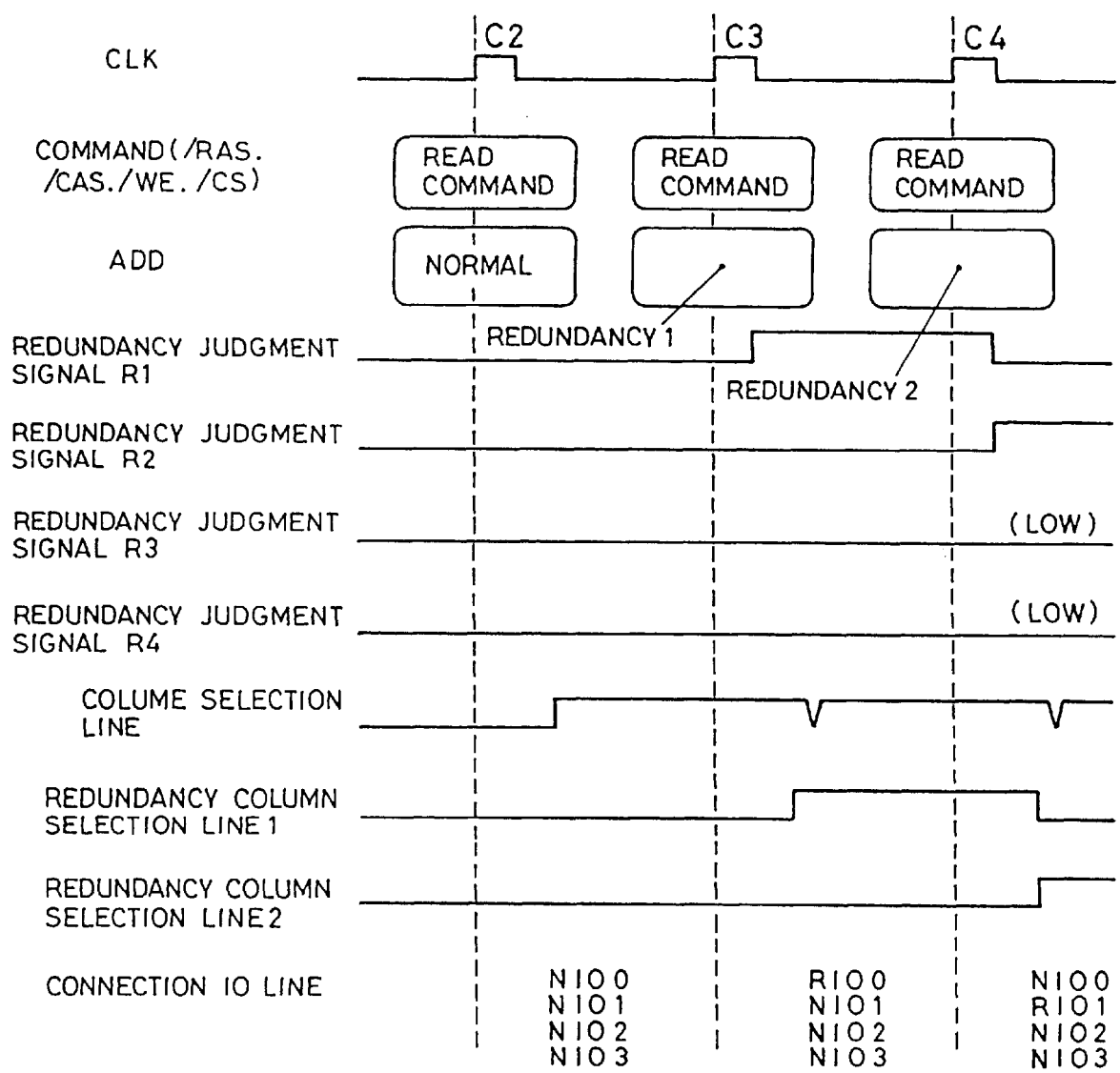
FIG. 7 is a timing chart showing an operation of another embodiment of the semiconductor storage device according to the present invention.

FIG. 7 is a timing chart showing operation of the foregoing another embodiment of the semiconductor storage device according to the present invention. The operation of another embodiment of the semiconductor storage device according to the present invention will be discussed with reference to FIGS. 5 to 7. Since cycles C2, C3 and C4 shown in FIG. 4 are read command inputs, one of the column selection lines corresponding to data of the address terminal ADD is selected.

When data of the address terminal ADD is the redundancy column address preliminarily programmed in the redundancy judgment circuit 11 upon rising the clock of the cycle C3, the redundancy judgment signal R1 output from the programmed redundancy judgment circuit 11 becomes selected condition (high level). Then, outputs of OR circuits 21 and 23 become high level. Accordingly, corresponding redundancy column selection line 2 is selected (high level) and the other redundancy column selection lines 1 are not selected (low level).

On the other hand, in the cycle C2, the outputs of the OR circuits 23 to 26 are respectively low level. In the cycle C3, the outputs of the OR circuits 23 to 26 are high level, low level, low level and low level. In the cycle C4, the outputs of the OR circuits 23 to 26 are low level, high level, low level and low level. Therefore, the IO lines are connected as shown in FIG. 7.

Namely, in the switching circuit 7 during the cycle C2, the switch 7e selects the IO line RIO0, the switch 7f selects the IO line NIO1, the switch 7g selects the IO line NIO2 and the switch 7h selects the IN line NIO3. Thus, data of the connected four IO lines RIO0, NIO1, NIO2 and NIO3 are transmitted to the amplifier circuit 6 via the four connection buses.

Namely, in the switching circuit 7 during the cycle C3, the switch 7e selects the IO line RIO0, the switch 7f selects the IO line NIO1, the switch 7g selects the IO line NIO2 and the switch 7h selects the IN line NIO3. Thus, data of the connected four IO lines RIO0, NIO1, NIO2 and NIO3 are transmitted to the amplifier circuit 6 via the four connection buses.

Namely, in the switching circuit 7 during the cycle C4, he switch 7e selects the IO line NO0, the switch 7f selects the IO line RO1, the switch 7g selects the IO line NIO2 and the switch 7h selects the IN line NIO3. Thus, data of the connected four IO lines NO0, RO1, NIO2 and NIO3 are transmitted to the amplifier circuit 6 via the four connection buses.

In the shown embodiment, as shown in FIG. 7, among the IO lines connected in the cycles C3 and C4, only RIO0 and RIO1 is connected to the redundancy sensing amplifier.

As set forth above, the shown embodiment provides four redundancy judgment circuits 11 to 18 for each redundancy column selection line and establishes correspondence of four IO lines to respective redundancy judgment circuits 11 to 18 for relieving the defective cell. Therefore, probability of relieving of the defective product can be improved further from the foregoing first embodiment.

Figure 8:
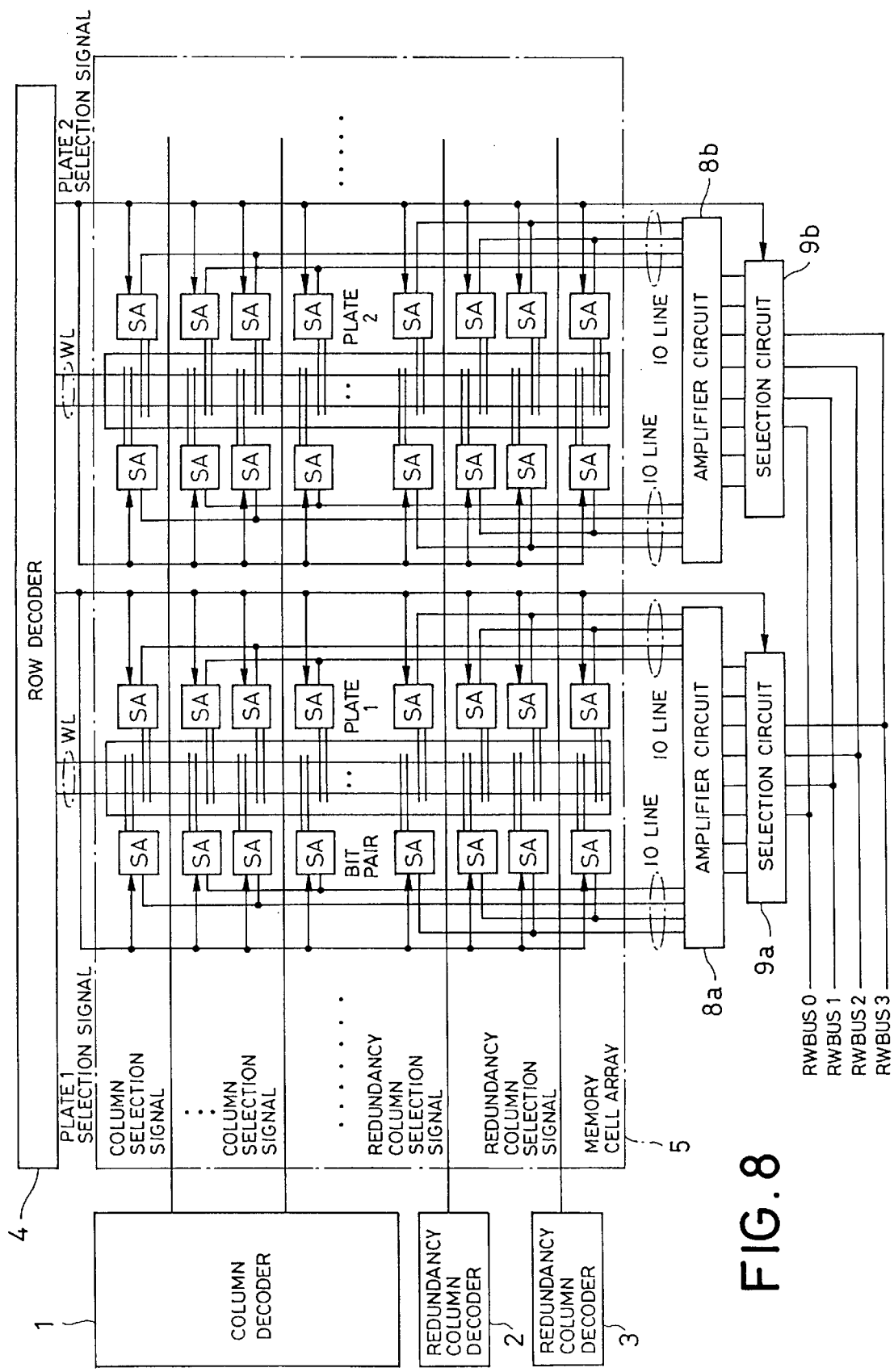
FIG. 8 is an illustration showing a detailed construction of a memory cell array of another embodiment of the present invention.

FIG. 8 is an illustration showing the detailed construction of another embodiment of the memory cell array according to the present invention. In FIG. 8, the memory cell array 5 is differentiated from one embodiment of the memory cell array 5 of FIG. 2, in that the IO line is not connected to the IO line of other plate outside of the memory cell 5.

On the other hand, the IO lines are connected to the amplifier circuits 8a and 8b separately through the IO lines transmitting data of the sense amplifier SA connected to the column selection line and the IO lines transmitted data of the sense amplifier SA connected to the redundancy column selection line. Outputs of the amplifier circuits 8a and 8b are input to switching circuits 9a and 9b for switching depending upon the redundancy judgment signal. Outputs of the switching circuits 9a and 9b are directly fed to the read/write buses RWBUS0 to RWBUS3.

In the shown embodiment, the amplifier circuits 8a and 8b and the switching circuits 9a and 9b are provided per plate. However, since the IO lines are provided per plate to reduce load to be advantageous for high speed process.

As set forth above, since a plurality of redundancy judgment circuits 11 to 18 are provided to permit programming of a plurality of relieving address for one redundancy column selection line, it becomes possible to relieve the column address of the defective cell can be relieved by the redundancy cell as a part of a plurality of memory cells selected by one redundancy column selection line and other redundancy cell. Thus, probability of relieving of the defective cell can be improved.

Although the present invention has been illustrated and described with respect to exemplary embodiments thereof, it should be understood by those skilled in the art that the foregoing and various changes, emission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A semiconductor storage device comprising:
    a redundancy cell for relieving a defective cell when the defective cell is found during fabrication process of a memory cell;
    a redundancy judgment circuit making judgment whether an input address is a column address of said defective cell or not;
    redundancy column selection lines for making said redundancy cell active when said redundancy judgment circuit makes judgment that said input address is said column address of said defective cell;
    means for dividing said redundancy cell connected to one redundancy column selection line into a plurality of divided redundancy cells and assigning the column address of said defective cell to each of divided redundancy cells as relieving address.

2. A semiconductor storage device as set forth in claim 1, wherein a plurality of said redundancy judgment circuits are provided for making judgment whether said input address is said relieving address assigned for each of said divided redundancy cell.

3. A semiconductor storage device as set forth in claim 2, which further comprises logic operation means for performing logical operation for respective outputs of a plurality of said redundancy judgment circuits and means for selecting any one of a plurality of redundancy column lines depending upon a result of operation of said logic operation means.

4. A semiconductor storage device as set forth in claim 3, wherein said logic operation means performs operation of logical sum of outputs of said plurality of redundancy judgment circuits.

5. A semiconductor storage device as set forth in claim 1, which further comprises means for switching between input/output line of said redundancy cell in said memory cell and normal input/output line depending upon a result of judgment by said redundancy judgment circuit.

6. A semiconductor storage device as set forth in claim 5, wherein said switching means is constructed for switching said input/output line of said redundancy cell and said input/output line of said normal cell.

7. A semiconductor storage device as set forth in claim 5, which is constructed to select the column selection line of said normal cell irrespective of the result of judgment of said redundancy judgment circuit.

8. A semiconductor storage device as set forth in claim 1, wherein said plurality of redundancy judgment circuits are provided corresponding to number of division of said redundancy cell.

9. A semiconductor storage device as set forth in claim 8, when said redundancy cell is divided into two, said redundancy judgment circuit in number of double of said redundancy column selection lines are provided.

10. A semiconductor storage device as set forth in claim 8, when said redundancy cell is divided into four, said redundancy judgment circuit in number of four times of said redundancy column selection lines are provided.

11. A semiconductor storage device as set forth in claim 3, wherein said means for selecting one of said plurality of redundancy column selection lines comprises a buffer circuit for driving selected redundancy column selection line.

* * * * *